United States Patent [19]
Hayashi et al.

[11] Patent Number: 6,083,886
[45] Date of Patent: Jul. 4, 2000

[54] METHOD OF PREPARING OXIDE SUPERCONDUCTING BULK BODY

[75] Inventors: Noriki Hayashi, Osaka; Masato Murakami, Tokyo, both of Japan

[73] Assignees: Sumitomo Electric Industries, Ltd., Osaka; International Superconductivity Technology Center, Tokyo, both of Japan

[21] Appl. No.: 09/110,405

[22] Filed: Jul. 6, 1998

[30] Foreign Application Priority Data

Jul. 4, 1997 [JP] Japan .................................. 9-179331

[51] Int. Cl.[7] .................................................. C30B 29/22
[52] U.S. Cl. .......................... 505/450; 505/451; 505/729
[58] Field of Search ..................... 505/450, 451, 505/729

[56] References Cited

U.S. PATENT DOCUMENTS

| | | | |
|---|---|---|---|
| 5,248,660 | 9/1993 | Lee et al. ................................. | 505/450 |
| 5,525,585 | 6/1996 | Suh et al. ................................ | 505/451 |
| 5,536,704 | 7/1996 | Yamada et al. ......................... | 505/451 |
| 5,611,854 | 3/1997 | Veal et al. .................................. | 117/1 |

FOREIGN PATENT DOCUMENTS

| | | | |
|---|---|---|---|
| 0 486 698 | 5/1992 | European Pat. Off. . | |
| 624664 | 11/1994 | European Pat. Off. ............... | 505/451 |
| 5-279032 | 10/1994 | Japan ..................................... | 505/452 |
| 8-133726 | 5/1996 | Japan . | |
| 96/21934 | 7/1996 | WIPO . | |

OTHER PUBLICATIONS

Sawano et al., "High Magentic Flux Trapping By Melt–Grown YBaCuO Superconductors", *Japanese Journal of Applied Physics*, vol.30(7A):L1157–L1159, (1991).

Ogawa et al., "Preparation of YBCO Bulk Superconductor by Plantinum Doped Melt Growth Method", *Supercond. Sci. Technol.*, vol. 5, pp. S89–S92, (1992).

Misao, "Production of Oxide Superconductor Material", Patent Abstact of Japan, vol. 96, No. 9, (Sep. 30, 1996), JP 08 133726, (Nippon Steel Corp.), May 28, 1996.

Takagi et al., "Preparation of Melt–Textured $NdBa_2Cu_3O_y$ Bulk With $Nd_4Ba_2Cu_2O_{10}$ Addition", *Physica C*, vol. 250, pp. 222–226, (1995).

A. Takagi et al., "Preparation of Melt–Textured $NdBa_2Cu_3O_y$ bulk with $Nd_4Ba_2Cu_2O_{10}$ addition", Physica, C250, (1996), pp. 222–226.

*Primary Examiner*—Robert Kunemund
*Attorney, Agent, or Firm*—Foley & Lardner

[57] ABSTRACT

Provided is a method of preparing a large-sized oxide superconducting bulk body having excellent characteristics and high homogeneity. The method is adapted to prepare an oxide superconducting bulk body by melt growth through a seed crystal method, and comprises steps of preparing a precursor by press-molding material powder obtained by mixing $REBa_2Cu_3O_{7-z}$ powder with $RE_2BaCuO_5$ or $RE_4Ba_2Cu_2O_{10}$ powder and a platinum additive, homogeneously semi-melting the precursor by holding the same at a holding temperature $T_1°$ C. ($t_1+20 \leq T_1 \leq t_1+80$ assuming that the melting point of the oxide superconducting bulk body is $t_1°$ C.) for a prescribed time, and crystal-growing the precursor at a temperature not more than the melting point $t_1°$ C.

19 Claims, 2 Drawing Sheets

METHOD OF PREPARING OXIDE SUPERCONDUCTING BULK BODY

BACKGROUND OF THE INVENTION

1. Field of the Invention

The present invention relates to a method of preparing an oxide superconducting bulk body, and more particularly, it relates to a method of preparing an oxide superconducting bulk body applied to a strong magnetic field magnet, a superconducting flywheel for storing energy, a superconducting carrying device, a superconducting bearing or the like, which is stably floated for use through the pinning characteristic of the oxide superconducting bulk body under a magnetic field.

2. Description of the Prior Art

Among oxide superconductors, an RE123 superconductor such as a Y123 ($YBa_2Cu_3O_{7-z}$) or Nd123 ($NdBa_2Cu_3O_{7-z}$) superconductor has an excellent pinning characteristic and becomes a superconductor having the performance of a magnet in a state capturing magnetic flux when cooled under a magnetic field. Further, such an oxide superconductor enters a normal conducting state from a superconducting state when its temperature is increased beyond the critical temperature. Thus, the oxide superconductor can be readily converted from a magnetic state to a non-magnetic or reverse state at need, to provide an industrial advantage.

As to the chemical formulas of RE123 superconductors having oxygen contents varying with preparation conditions, the atomic ratio of oxygen is expressed as "7-Z" throughout the specification. The value Z is within the range of $0 \leq Z \leq 0.5$ in general.

In general, a method of preparing an oxide superconducting bulk body of such a Y123 or Nd123 superconductor is carried out by heating a previously press-molded precursor in an oxide superconducting bulk preparation apparatus and holding the same at a temperature converting the RE123 ($REBa_2Cu_3O_{7-z}$) superconductor to a liquid phase while not converting an RE211 ($RE_2BaCu_3O_5$) or RE422 ($RE_4Ba_2Cu_3O_{10}$) superconductor to a liquid phase, i.e., keeping the same in a solid phase as the maximum temperature. This state, including liquid and solid phases, is referred to as a semi-melted or partially melted state.

For example, Japanese Patent Laying-Open No. 8-133726 (1996) discloses a method of preparing an oxide superconducting material comprising steps of heating a precursor to a temperature range of 950 to 1350° C. as a heat treatment for bringing the precursor into a semi-melted state and thereafter cooling the semi-melted precursor for crystallizing the same.

On the other hand, another literature (Physica C250, 1995, pp. 222 to 226) discloses a method of holding a press-molded pellet of 20 mm in diameter and 10 mm in thickness at 1070° C. for 0.5 hours thereby leaving no solid-phase RE123 semiconductor in a later step.

In practice, an oxide superconducting bulk body must be large-sized to some extent. It has been clarified through electromagnetic calculation that a combination of a plurality of small bulk bodies cannot attain the performance of a large-sized bulk body.

In practical use, therefore, it is indispensable to prepare an oxide superconducting bulk body having a certain measure of size. If the thickness of the bulk body is too large, however, the captured magnetic field is saturated. In order to increase the captured magnetic field, therefore, it is necessary to prepare a bulk body having a large plane size.

If such a large-sized oxide superconducting bulk body is prepared under conditions similar to those generally employed for preparing a relatively small-sized bulk body, however, desired characteristics cannot be attained.

SUMMARY OF THE INVENTION

In order to solve the aforementioned problems, an object of the present invention is to provide a method of preparing a large-sized oxide superconducting bulk body having excellent characteristics and high homogeneity.

The inventors have made a series of experiments in order to attain the aforementioned object, to find out that a precursor is not homogeneously semi-melted under general conditions for preparing a relatively large-sized bulk body, due to an insufficient holding time for semi-melting a large precursor.

The inventors held precursors for Sm oxide superconductors each having a diameter of 37 mm and a thickness of 21 mm under a 1% oxygen atmosphere at a temperature higher than the melting point by 60° C. for prescribed times for semi-melting the same and thereafter quenched the precursors, for observing sections of the obtained samples. As a result, a horizontally elliptic separation phase was observed when the precursor was held for a short holding time of 0.5 hours, while no separation phase was observed when held for a long holding time of two hours.

Then, the inventors cooled the samples passed through the semi-melting step in the aforementioned manner for making crystal growth and preparing oxide superconducting bulk bodies. As a result, the superconducting bulk body prepared from the sample held for a long time to present no separation phase exhibited a homogeneous section with no separation phase. On the other hand, the inventors carefully polished a section of the superconducting bulk body prepared from the sample held for a short time to present a separation phase and observed the same, to find out that the section was separated into two phases. Further, the critical current density of this sample was heterogeneous.

It has been proved from these experimental results that the precursor is so heterogeneously semi-melted that the characteristics in the interior of the bulk body are dispersed after crystal growth if the holding time for semi-melting the precursor is insufficient. It has also been proved that, if the precursor is insufficiently semi-melted, the RE123 phase is partially left in an undissolved state and serves as a nucleus starting crystal growth, to disadvantageously result in polycrystallization.

The precursor may be held at a high temperature less than a level allowing no liquefaction of the RE211 or RE422 phase for a long time, in order to semi-melting the precursor. In case of holding the precursor at a high temperature for a long time, however, this may result in the following disadvantages:

First, the viscosity of the liquid phase is reduced as the temperature is increased, such that the liquid phase component flows out to deform the precursor, and pores may be formed in the interior even if the precursor is held for a short time. Further, the precursor readily reacts with a member receiving the same as the temperature is increased.

On the other hand, the precursor may be held at a temperature slightly higher than the melting point of the RE123 phase for a long time. In this case, however, grain growth of the RE211 or RE422 phase takes place to cause a disadvantage in holding of the liquid phase component, which in turn may flow out. Further, roughening of RE211 or RE422 grains forming the second phase causes reduction of the superconductivity. Platinum (or platinum oxide) may be introduced by 0.3 to 0.5% in weight percentage, in order to suppress roughening of the crystal grains of the RE211 or RE422 phase. In case of holding the precursor at the temperature slightly higher than the melting point for a long time, however, it is difficult to suppress roughening of the crystal grains.

Thus, it is understood desirable to semi-melt the precursor for the minimum time.

In consideration of the aforementioned points, a method of preparing an oxide superconducting bulk body is provided in accordance with an aspect of the present invention. This method, which is adapted to prepare an oxide superconducting bulk body by melt growth through a seed crystal method, comprises steps of preparing a precursor by press-molding material powder obtained by mixing RE123 powder with RE211 or RE422 powder and powder of a platinum compound, homogeneously semi-melting the precursor by holding the same at a holding temperature $T_1°$ C. ($t_1+20 \leq T_1 \leq t_1+80$ assuming that the melting point of the oxide superconducting bulk body is $t_1°$ C.) for a prescribed time, and crystal-growing the precursor at a temperature not more than the melting point $t_1°$ C.

According to another aspect of the present invention, a method of preparing an oxide superconducting bulk body is provided. This method, which is adapted to prepare an oxide superconducting bulk body by melt growth through a seed crystal method, comprises steps of preparing a precursor by press-molding material powder obtained by mixing RE123 powder with RE211 or RE422 powder and powder of a platinum compound, homogeneously semi-melting the precursor by holding the same at a holding temperature $T_1°$ C. ($t_1+20 \leq T_1 \leq t_1+80$ assuming that the melting point of the oxide superconducting bulk body is $t_1°$ C.) for a prescribed time, cooling the semi-melted precursor to a temperature $T_2°$ C. ($t_1 \leq T_2 \leq t_1+20$), setting a seed crystal on the precursor cooled to the temperature $T_2°$ C., and crystal-growing the precursor at a temperature not more than the melting point $t_1°$ C. If the melting point of the seed crystal is sufficiently high, the seed crystal may be set before the heating.

According to the present invention, crystal growth is preferentially made from the seed crystal at the temperature not more than the melting point $t_1°$ C. Therefore, an oxide superconducting bulk body having a single-domain structure can be prepared according to the inventive method.

According to the present invention, further, the precursor is homogeneously semi-melted and thereafter cooled to the temperature $T_2°$ C., so that the seed crystal is thereafter set on the precursor. In this case, the seed crystal is not entirely melted in a short time but only partially dissolved at the temperature $T_2°$ C. Therefore, adhesion between the seed crystal and the surface of the precursor is so improved that the seed crystal reliably acts on the crystal growth.

In the present invention, the seed crystal is preferably prepared from a single crystal or a single-domain crystal of a material identical to that for the oxide superconducting bulk body, an oxide superconducting material having a higher melting point, or a material having a close lattice constant (not more than 10%) and a sufficiently high melting point.

According to still another aspect of the present invention, a method of preparing an oxide superconducting bulk body is provided. This method, which is adapted to prepare an oxide superconducting bulk body by melt growth through a seed crystal method, comprises steps of preparing a precursor by press-molding material powder obtained by mixing RE123 powder with RE211 or RE422 powder and powder of a platinum compound, homogeneously semi-melting the precursor by holding the same at a holding temperature $T_1°$ C. ($t_1+20 \leq T_1 \leq t_1+80$ assuming that the melting point of the oxide superconducting bulk body is $t_1°$ C.) for a prescribed time, cooling the semi-melted precursor to a temperature not more than the melting point $t_1°$ C. for solidifying the same, setting a seed crystal having a melting point $t_2°$ C. higher than the melting point $t_1°$ C. of the oxide superconducting bulk body on the solidified precursor, melting the precursor at a temperature of at least $t_1°$ C. and not more than $t_2°$ C., and crystal-growing the melted precursor at a temperature not more than the melting point $t_1°$ C.

The present invention is applied to such case that the melting point of the seed crystal is higher than that of the oxide superconducting bulk body. According to the present invention, the seed crystal can be set on the precursor temporarily cooled and solidified, whereby workability is improved as compared with the case of setting the seed crystal on a precursor of a high-temperature state.

According to the present invention, preferable relations between the holding temperature and the time in the step of homogeneously semi-melting the precursor are as follows:

When the holding temperature $T_1(°$ C.$)$ is equal to $t_1+20$, the holding time X (hour) satisfies $X \geq (d+2.3)/4$, assuming that d represents the thickness of the precursor.

When the holding temperature $T_1(°$ C.$)$ is equal to $t_1+40$, the holding time X (hour) satisfies $X \geq (d-0.3)/6.8$, assuming that d represents the thickness of the precursor.

When the holding temperature $T_1(°$ C.$)$ is equal to $t_1+60$, the holding time X (hour) satisfies $X \geq (d-0.5)/13.2$, assuming that d represents the thickness of the precursor.

When the holding temperature $T_1(°$ C.$)$ is equal to $t_1+80$, the holding time X (hour) satisfies $X \geq (d-2)/20$, assuming that d represents the thickness of the precursor.

In the present invention, an RE semiconductor (a single or mixed system of Nd, Sm, Eu, Gd, Dy, Y, Ho and/or Er) is preferably employed as the material for the oxide superconducting bulk body.

The melting points of these materials under oxygen partial pressure of $10^{-2}$ atm. are as follows:

TABLE 1

| Oxide Superconducting Material | Melting Point (Decomposition Temperature) [° C.] |
|---|---|
| Nd | 1035 |
| Sm | 1023 |
| Eu | 1016 |
| Gd | 1006 |
| Dy | 978 |
| Y | 974 |
| Ho | 968 |
| Er | 954 |

The present invention is directed to a large-sized oxide superconducting bulk body of at least 50 mm in diameter or length of one side and at least about 10 mm in thickness.

The material for the oxide superconducting bulk body prepared in the present invention is obtained by mixing $REBa_2Cu_3O_{7-z}$ (RE123) with $RE_2BaCuO_5$ (Re211) or $RE_4Ba_2Cu_2O_{10}$ (RE422), and the molar ratio of the RE211 or RE422 phase to the RE123 phase is preferably at least 0.05 and not more than 0.5.

The RE211 or RE422 phase is mixed into the RE123 phase for the following reasons:

First, the RE211 or RE422 phase which is a normal conducting phase is intentionally added to the RE123 phase for serving as a pinning center under a low magnetic field, whereby the critical current density can be increased under the low magnetic field. Second, the RE211 or RE422 phase, which remains solid at the temperature for semi-melting the precursor, can hold the shape of the precursor for inhibiting the RE123 component converted to a liquid phase from flowing out to the exterior. Third, microcracks can be caused due to the difference between the thermal expansion coefficients of the RE123 component and the RE211 or RE422 component, for increasing macro-strength as well as the oxygen diffusion rate.

If the molar ratio of the RE211 or RE422 phase is too small, neither the effect of inhibiting the RE123 component from flowing out nor the effect of increasing the oxygen diffusion rate due to the difference between the thermal expansion coefficients can be sufficiently attained. If the molar ratio of the RE211 or RE422 phase is too high, on the other hand, the effect of improving the critical current density cannot be sufficiently attained while the ratio of the RE123 component is reduced, to disadvantageously reduce the ratio of the superconductor.

According to the present invention, as hereinabove described, the structure of an RE oxide superconducting bulk body prepared under low oxygen partial pressure can be controlled for preparing a large-sized bulk body having high homogeneity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
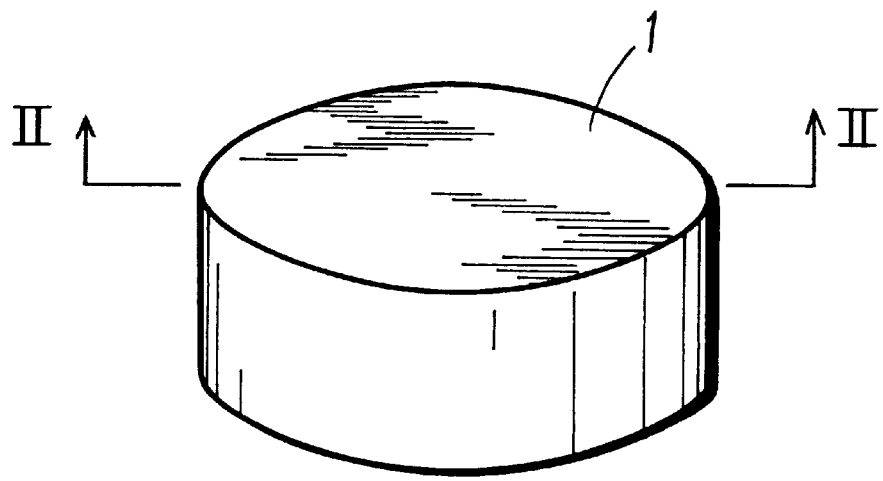
FIG. 1 is a perspective view showing an oxide superconducting bulk body obtained by crystal growth.

Powder materials having a composition of $SM_{1.8}Ba_{2.4}Cu_{3.4}O_y$ with addition of 0.5 wt. % of platinum powder were molded in a press uniaxial direction, and pressure of 2000 atm. was isotropically supplied with a CIP (cold isostatical press), to obtain precursors of 40 mm in diameter and 21 mm in thickness. The precursors were heated in an electric furnace which was fed with mixed gas (argon/oxygen) having an oxygen concentration of 1%, and held under low oxygen partial pressure (oxygen: 1%) at maximum temperatures higher than the melting point by 20° C., 40° C., 60° C. and 80° C. respectively for times shown in Tables 2 to 5.

Thereafter the furnace was brought into a power-off state for furnace-cooling the precursors. The obtained samples were taken out from the furnace and perpendicularly cut for investigation of the sections. The samples included those separated into two phases and those remained in unseparated states at the respective holding temperatures in accordance with the holding times.

Tables 2 to 5 show the obtained results. Tables 2, 3, 4 and 5 show the results of the samples held at the melting point +20° C., the melting point +40° C., the melting point +60° C. and the melting point +80° C. respectively.

TABLE 2

| Holding Temperature × Holding Time | Upper Distance (mm) | Lower Distance (mm) | Distance from Side Surface (Left: mm) | Distance from Side Surface (Right: mm) | Weight After Holding (%) |
|---|---|---|---|---|---|
| 1043° C. × 0 h | 0 | 0 | 0 | 0 | 0.99276 |
| 1043° C. × 1 h | 2.0 | 0 | 2.0 | 2.0 | 0.98126 |
| 1043° C. × 1.5 h | 2.8 | 1.0 | 3.0 | 2.7 | 0.98048 |
| 1043° C. × 2 h | 3.5 | 1.3 | 4.0 | 4.0 | 0.97500 |
| 1043° C. × 3 h | 5.5 | 3.5 | 8.0 | 8.0 | 0.97630 |
| 1043° C. × 4 h | un-separated | un-separated | un-separated | un-separated | 0.97641 |

TABLE 3

| Holding Temperature × Holding Time | Upper Distance (mm) | Lower Distance (mm) | Distance from Side Surface (Left: mm) | Distance from Side Surface (Right: mm) | Weight After Holding (%) |
|---|---|---|---|---|---|
| 1063° C. × 0 h | 0.8 | 0 | 0.5 | 0.5 | 0.98941 |
| 1063° C. × 0.5 h | 2.7 | 0.8 | 2.8 | 2.8 | 0.98151 |
| 1063° C. × 0.75 h | 3.8 | 2.0 | 4.0 | 4.0 | 0.98033 |
| 1063° C. × 1 h | 4.5 | 2.5 | 5.0 | 5.0 | 0.97876 |
| 1063° C. × 1.5 h | 6.9 | 4.0 | 9.0 | 9.0 | 0.97821 |
| 1063° C. × 2 h | un-separated | un-separated | un-separated | un-separated | 0.97647 |

TABLE 4

| Holding Temperature × Holding Time | Upper Distance (mm) | Lower Distance (mm) | Distance from Side Surface (Left: mm) | Distance from Side Surface (Right: mm) | Weight After Holding (%) |
|---|---|---|---|---|---|
| 1083° C. × 0 h | 1.0 | 0 | 1.0 | 1.0 | 0.98177 |
| 1083° C. × 0.25 h | 3.0 | 1.5 | 3.3 | 3.0 | 0.98195 |
| 1083° C. × 0.5 h | 4.5 | 2.5 | 5.3 | 5.3 | 0.97989 |
| 1083° C. × 0.75 h | 6.45 | 4.0 | 8.5 | 8.5 | 0.97899 |
| 1083° C. × 1 h | un-separated | un-separated | un-separated | un-separated | 0.97652 |

TABLE 5

| Holding Temperature × Holding Time | Upper Distance (mm) | Lower Distance (mm) | Distance from Side Surface (Left: mm) | Distance from Side Surface (Right: mm) | Weight After Holding (%) |
|---|---|---|---|---|---|
| 1103° C. × 0 h | 2.0 | 0.5 | 2.5 | 2.5 | 0.98024 |
| 1103° C. × 0.25 h | 4.7 | 2.5 | 5.0 | 5.0 | 0.97994 |
| 1103° C. × 0.383 h | 5.2 | 3.5 | 6.5 | 6.5 | 0.97802 |
| 1103° C. × 0.5 h | 7.0 | 5.5 | 11 | 11 | 0.97862 |

TABLE 5-continued

| Holding Temperature × Holding Time | Upper Distance (mm) | Lower Distance (mm) | Distance from Side Surface (Left: mm) | Distance from Side Surface (Right: mm) | Weight After Holding (%) |
|---|---|---|---|---|---|
| 1103° C. × 1 h | un-separated | un-separated | un-separated | un-separated | 0.97693 |

Figure 3:
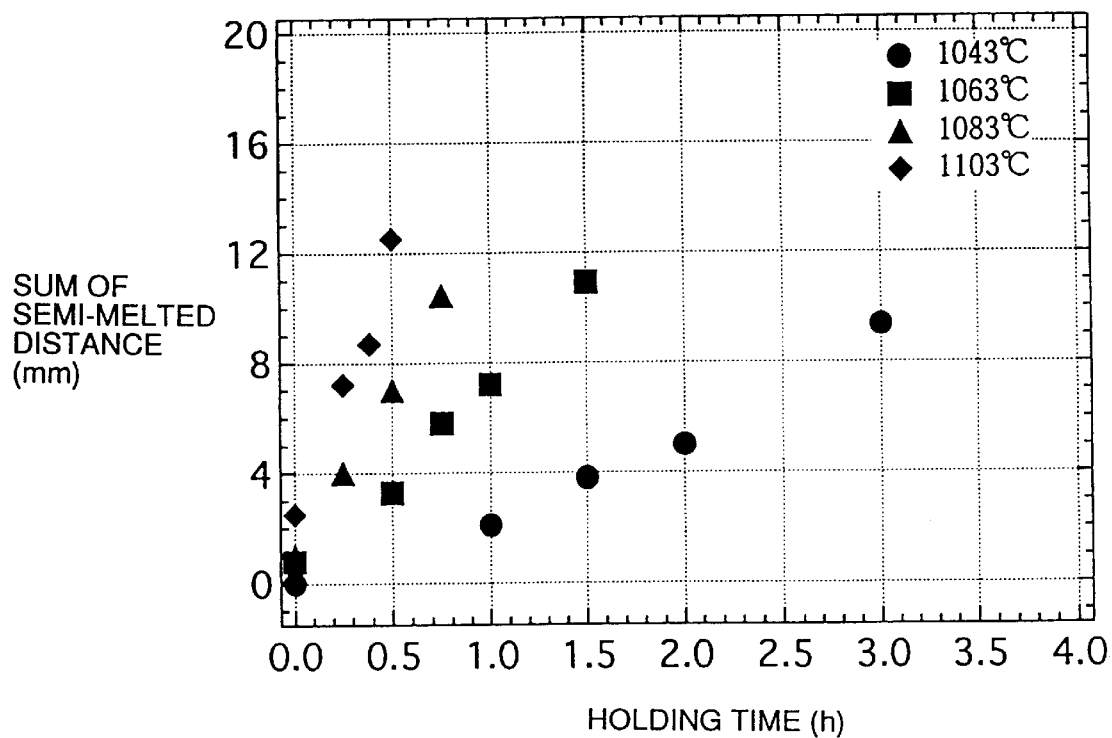
FIG. 3 illustrates the relations between the sums of distances between upper surfaces of samples and boundary lines of separation phases and those between lower surfaces and the boundary lines of the separation phases and holding times.

The relations between the sums of the distances between upper surfaces of the samples and boundary lines of separation phases and those between lower surfaces and the boundary lines of the separation phases are plotted in FIG. 3. These relations were substantially linear at the respective temperatures. The times necessary for semi-melting the precursor at the respective holding temperatures in the present invention were derivable from these results.

More concrete Examples of the present invention are now described.

EXAMPLE 1

Powder prepared by adding 0.5 wt. % of platinum powder to powder composed of $RE_{1.8}Ba_{2.4}Cu_{3.4}O_y$ (RE=Nd, Sm, Eu, Gd, Dy, Y, Ho and/or Er) and mixing these powder materials with each other was molded in a press uniaxial direction, and pressure of 2000 atm. was isotropically supplied with a CIP, to obtain precursors of 55 mm in diameter and 23 mm in thickness. The obtained precursors were heated in an electric furnace which was fed with mixed gas (argon/oxygen) having an oxygen concentration of 1%, and held under low oxygen partial pressure of $10_{-2}$ atm. (oxygen: 1%) at maximum temperatures higher than the melting point by $\delta T°$ C. for times shown in Table 6.

Thereafter the furnace was brought into a power-off state for furnace-cooling the precursors. The samples taken out from the furnace were 50 mm in diameter and 20 mm in thickness, with slight dispersion (±1 mm). The samples were perpendicularly cut and the sections thereof were investigated. It was confirmed that all samples were homogeneous with no portions separated into two phases.

TABLE 6

| Sample No. | δT (° C.) | Holding Time (h) |
|---|---|---|
| 1 | 20 | 6.5 |
| 2 | 40 | 3 |
| 3 | 40 | 6.5 |
| 4 | 60 | 1.5 |
| 5 | 60 | 3 |
| 6 | 60 | 6.5 |
| 7 | 80 | 1 |
| 8 | 80 | 1.5 |
| 9 | 80 | 3 |
| 10 | 80 | 6.5 |

EXAMPLE 2

In relation to an Sm oxide superconducting material, a precursor was held under low oxygen partial pressure of $10_{-2}$ atm. (oxygen: 1%) at the maximum temperature of 1103° C. (melting point 1023° C.+80° C.) for one hour through a step identical to that in Example 1 to be semi-melted, and thereafter the temperature of an upper portion of the sample was reduced to 1023° C. while vertically supplying a temperature gradient of 7.5° C./cm so that a lower portion was at a high temperature, for making crystal growth at a cooling rate of 0.5° C./h. Before the heating, a seed crystal of MgO (100) was set on the center of a surface of this precursor.

Figure 2:
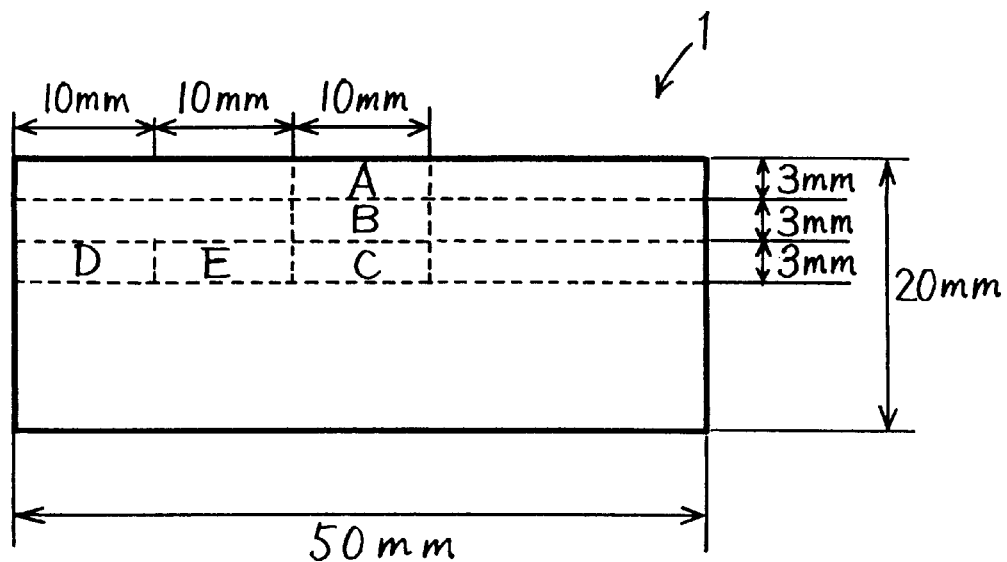
FIG. 2 is a sectional view taken along the line II—II in FIG. 1.

FIG. 1 is a perspective view showing an oxide superconducting bulk body 1 obtained by the crystal growth, and FIG. 2 is a sectional view taken along the line II—II in FIG. 1.

After completion of the crystal growth, the oxide superconducting bulk body 1 was heat-treated in an oxygen atmosphere at 300° C. for 200 hours, taken out from the furnace and cut for measurement of field characteristics of respective portions A to E shown in FIG. 2 with a SQUID (superconducting quantum interference device).

Tables 7 and 8 show the results. Table 7 shows critical current densities Jc (A/cm$^2$) at 77 K and 0 T, and Table 8 shows critical current densities Jc (A/cm$^2$) at 77 K and 2 T.

TABLE 7

| Portion | Jc(A/cm$^2$) |
|---|---|
| A | 3.5 × 10$^4$ |
| B | 3.4 × 10$^4$ |
| C | 3.5 × 10$^4$ |
| D | 3.2 × 10$^4$ |
| E | 3.4 × 10$^4$ |
| | (77K, 0T) |

TABLE 8

| Portion | Jc(A/cm$^2$) |
|---|---|
| A | 2.3 × 10$^4$ |
| B | 2.4 × 10$^4$ |
| C | 2.4 × 10$^4$ |
| D | 2.2 × 10$^4$ |
| E | 2.3 × 10$^4$ |
| | (77K, 2T) |

EXAMPLE 3

In relation to an Nd oxide superconducting material, a precursor was held under low oxygen partial pressure of $10^{-2}$ atm. (oxygen: 1%) at the maximum temperature of 1115° C. (melting point 1035° C.+80° C.) for one hour through a step identical to that in Example 1 to be semi-melted, and thereafter the temperature of an upper portion of the sample was reduced to 1035° C. while vertically supplying a temperature gradient of 7.5° C./cm so that a lower portion was at a high temperature, for making crystal growth at a cooling rate of 0.5° C./h. Before the heating, a seed crystal of MgO (100) was set on the center of a surface of this precursor.

After completion of the crystal growth, the obtained oxide superconducting bulk body was heat-treated in an oxygen atmosphere at 300° C. for 200 hours, taken out from the furnace and cut for measurement of field characteristics of the respective portions A to E shown in FIG. 2 with a SQUID.

Tables 9 and 10 show the results. Table 9 shows critical current densities Jc (A/cm$^2$) at 77 K and 0 T, and Table 10 shows critical current densities Jc (A/cm$^2$) at 77 K and 2 T.

TABLE 9

| Portion | Jc(A/cm$^2$) |
| --- | --- |
| A | 3.8 × 10$^4$ |
| B | 3.7 × 10$^4$ |
| C | 3.7 × 10$^4$ |
| D | 3.6 × 10$^4$ |
| E | 3.8 × 10$^4$ |
|   | (77K, 0T) |

TABLE 10

| Portion | Jc(A/cm$^2$) |
| --- | --- |
| A | 2.5 × 10$^4$ |
| B | 2.6 × 10$^4$ |
| C | 2.7 × 10$^4$ |
| D | 2.5 × 10$^4$ |
| E | 2.7 × 10$^4$ |
|   | (77K, 2T) |

EXAMPLE 4

In relation to an Sm oxide superconducting material, a precursor was held under low oxygen partial pressure of $10^{-2}$ atm. (oxygen: 1%) at the maximum temperature of 1103° C. (melting point 1023° C.+800° C.) for one hour through a step identical to that in Example 1 to be semi-melted. Thereafter the temperature of an upper portion of the sample was reduced to 1043° C. while vertically supplying a temperature gradient of 7.5° C./cm so that a lower portion was at a high temperature. A single-domain crystal cut out from an Sm123 oxide superconducting bulk body similarly prepared by a melt method was set on the center of a surface of the sample as a seed crystal, and held for 30 minutes. Thereafter the temperature was reduced to 1023° C. and crystal growth was made at a rate of 0.5° C./h.

After the crystal growth, the obtained oxide superconducting bulk body was taken out from the furnace, to confirm that the crystal was grown in a faceted manner at equal angles of 90°. The bulk body was cut in parallel with its surface, to confirm that the cut-out plane was the cleavage plane. The sample was cooled in a magnetic field, which in turn was removed for measuring the remaining captured magnetic field distribution with a Hall element. The magnetic flux distribution drew a circular contour line and exhibited a single peak.

EXAMPLE 5

In relation to an Sm oxide superconducting material, a precursor was held under low oxygen partial pressure of $10^{-2}$ atm. (oxygen: 1%) at the maximum temperature of 1083° C. (melting point 1023° C.+60° C.) for 1.5 hours through a step identical to that in Example 1 to be semi-melted. Then, the temperature of an upper portion of the sample was reduced to 1028° C. while vertically supplying a temperature gradient of 7.5° C./cm so that a lower portion was at a high temperature. A single-domain crystal cut out from an Sm123 oxide superconducting bulk body similarly prepared by a melt method was set on the center of a surface of the sample as a seed crystal, and held for two hours. Thereafter the temperature was reduced to 1023° C. and crystal growth was made at a rate of 0.5° C./h.

After the crystal growth, the obtained oxide superconducting bulk body was taken out from the furnace, to confirm that the crystal was grown in a faceted manner at equal angles of 90°. The bulk body was cut in parallel with its surface, to confirm that the cut-out plane was the cleavage plane. The sample was cooled in a magnetic field, which in turn was removed for measuring the remaining captured magnetic field distribution with a Hall element. The magnetic flux distribution drew a circular contour line and exhibited a single peak.

EXAMPLE 6

In relation to an Sm oxide superconducting material, a precursor was held under low oxygen partial pressure of $10^{-2}$ atm. (oxygen: 1%) at the maximum temperature of 1083° C. (melting point 1023° C.+60° C.) for 1.5 hours through a step identical to that in Example 1 to be semi-melted. The precursor was quenched by furnace cooling to reach the room temperature, and thereafter a single-domain crystal cut out from an Nd123 oxide superconducting bulk body prepared by a melt method was set on the center of a surface of the sample as a seed crystal. Then, the temperature was increased to 1043° C., and held for one hour. Thereafter the temperature of an upper portion of the sample was reduced to 1023° C. while vertically supplying a temperature gradient of 7.5° C./cm so that a lower portion was at a high temperature, for making crystal growth at a rate of 0.5° C./h.

After the crystal growth, the obtained oxide superconducting bulk body was taken out from the furnace, to confirm that the crystal was grown in a faceted manner at equal angles of 90°. The bulk body was cut in parallel with its surface, to confirm that the cut-out plane was the cleavage plane. The sample was cooled in a magnetic field, which in turn was removed for measuring the remaining captured magnetic field distribution with a Hall element. The magnetic flux distribution drew a circular contour line and exhibited a single peak.

COMPARATIVE EXAMPLE 1

Powder composed of $RE_{1.8}Ba_{2.4}Cu_{3.4}O_y$ (RE=Nd, Sm, Eu, Gd, Dy, Y, Ho and/or Er) was molded in a press uniaxial direction, and pressure of 2000 atm. was isotropically supplied with a CIP, to obtain precursors of 55 mm in diameter and 23 mm in thickness. The obtained precursors were heated in an electric furnace which was fed with mixed gas (argon/oxygen) having an oxygen concentration of 1%, and held under low oxygen partial pressure of $10^{-2}$ atm. (oxygen: 1%) at maximum temperatures higher than the melting point by δT° C. for times shown in Table 11.

Thereafter the furnace was brought into a power-off state for furnace-cooling the precursors. The samples taken out from the furnace were 50 mm in diameter and 20 mm in thickness, with slight dispersion (±1 mm). The samples were perpendicularly cut and the sections thereof were investigated. Sections of all samples semi-melted at the temperatures higher than the melting point by 20° C., 40° C., 60° C. and 80° C. were separated into two phases. In all samples semi-melted at the temperatures higher than the melting point by 100° C. and 120° C., on the other hand, pores were observed on the sections.

TABLE 11

| Sample No. | δT (° C.) | Holding Time (h) |
| --- | --- | --- |
| 1 | 20 | 0.5 |
| 2 | 20 | 1 |
| 3 | 20 | 1.5 |
| 4 | 20 | 3 |

TABLE 11-continued

| Sample No. | δT (° C.) | Holding Time (h) |
|---|---|---|
| 5 | 20 | 5.2 |
| 6 | 40 | 0.5 |
| 7 | 40 | 1 |
| 8 | 40 | 2.5 |
| 9 | 60 | 0.5 |
| 10 | 60 | 1.3 |
| 11 | 80 | 0.5 |
| 12 | 100 | 0.5 |
| 13 | 100 | 1 |
| 14 | 100 | 1.5 |
| 15 | 100 | 3 |
| 16 | 100 | 6.5 |
| 17 | 120 | 0.5 |
| 18 | 120 | 1 |
| 19 | 120 | 1.5 |
| 20 | 120 | 3 |
| 21 | 120 | 6.5 |

COMPARATIVE EXAMPLE 2

In relation to RE (Nd, Sm, Eu, Gd, Dy, Y, Ho and/or Er), precursors were held at maximum temperatures higher than the melting points of the respective superconductors at oxygen partial pressure of $10^{-2}$ atm. by 80° C. for 0.5 hours to be semi-melted. Then, the temperatures on upper portions of the samples were reduced to the melting points of the respective superconductors while vertically supplying a temperature gradient of 7.5° C./cm so that lower portions were at high temperatures, for making crystal growth at a cooling rate of 0.5° C./h. Before the heating, seed crystals of MgO (100) were set on the centers of surfaces of the precursors.

After completion of the crystal growth, the obtained oxide superconducting bulk bodies were taken out from the furnace and perpendicularly cut so that the sections were polished. It was confirmable that the sections of all samples were separated into two phases.

COMPARATIVE EXAMPLE 3

In relation to an Sm oxide superconducting material, a precursor was held under low oxygen partial pressure of $10^{-2}$ atm. (oxygen: 1%) at the maximum temperature of 1103° C. (melting point 1023° C.+80° C.) for 0.5 hours through a step identical to that in Example 1 to be semi-melted. Then, the temperature of an upper portion of the sample was reduced to 1023° C. while vertically supplying a temperature gradient of 7.5° C./cm so that a lower portion was at a high temperature, for making crystal growth at a cooling rate of 0.5° C./h. Before the heating, a seed crystal of MgO (100) was set on the center of a surface of the precursor.

After the crystal growth, the obtained oxide superconducting bulk body was taken out from the furnace and perpendicularly cut so that the section was polished. It was confirmable that the section was separated into two phases.

The respective portions A to E shown in FIG. 2 were heat-treated with a SQUID in an oxygen atmosphere at 300° C. for 200 hours, for investigation of the magnetic field characteristics of the sample.

Tables 12 and 13 show the results. Table 12 shows critical current densities Jc (A/cm$^2$) at 77 K and 0 T, and Table 13 shows critical current densities Jc (A/cm$^2$) at 77 K and 2 T.

TABLE 12

| Portion | Jc(A/cm$^2$) |
|---|---|
| A | 3.7 × 10$^4$ |
| B | 3.4 × 10$^4$ |
| C | 3.0 × 10$^4$ |
| D | 3.5 × 10$^4$ |
| E | 3.3 × 10$^4$ |
| | (77K, 0T) |

TABLE 13

| Portion | Jc(A/cm$^2$) |
|---|---|
| A | 1.9 × 10$^4$ |
| B | 1.8 × 10$^4$ |
| C | 1.5 × 10$^4$ |
| D | 1.3 × 10$^4$ |
| E | 1.5 × 10$^4$ |
| | (77K, 2T) |

COMPARATIVE EXAMPLE 4

In relation to an Sm oxide superconducting material, a precursor was held under low oxygen partial pressure of $10^{-2}$ atm. (oxygen: 1%) at the maximum temperature of 1103° C. (melting point 1023° C.+80° C.) for 1.5 hours through a step identical to that in Example 4 to be semi-melted. Then, the temperature of an upper portion of the sample was reduced to 1043° C. while vertically supplying a temperature gradient of 7.5° C./cm so that a lower portion was at a high temperature. A single-domain crystal cut out from an Sm123 oxide superconducting bulk body similarly prepared by a melt method was set on the center of a surface of the sample as a seed crystal, and held for 3 hours. Thereafter the temperature was reduced to 1023° C. and crystal growth was made at a rate of 0.5° C./h.

After the crystal growth, the sample was taken out from the furnace. It was observed that the seed crystal was dissolved and no crystal was grown in a faceted manner.

COMPARATIVE EXAMPLE 5

In relation to an Sm oxide superconducting material, a precursor was held under low oxygen partial pressure of $10^{-2}$ atm. (oxygen: 1%) at the maximum temperature of 1083° C. (melting point 1023° C.+60° C.) for 0.5 hours through a step identical to that in Example 6 to be semi-melted. The precursor was quenched by furnace cooling to reach the room temperature, and a single-domain crystal cut out from an Nd123 oxide superconducting bulk body prepared by a melt method was set on the center of a surface of the sample as a seed crystal. Then, the temperature was increased to 1043° C., and held for one hour. Thereafter the temperature of an upper portion of the sample was reduced to 1023° C. while vertically supplying a temperature gradient of 7.5° C./cm so that a lower portion was at a high temperature, for making crystal growth at a rate of 0.5° C./h.

After the crystal growth, the obtained oxide superconducting bulk body was taken out from the furnace, to confirm that the crystal was grown in a faceted manner at equal angles of 90°. The bulk body was cut in parallel with its surface, to confirm that the cut-out plane was the cleavage plane, while a portion around the center was not dense but exhibited cracks.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing an oxide superconducting bulk body by melt growth through a seed crystal method, comprising steps of:

preparing a precursor by press-molding material powder obtained by mixing $REBa_2Cu_3O_{7-z}$ powder with $RE_2BaCuO_5$ or $RE_4Ba_2Cu_2O_{10}$ powder and a platinum additive;

homogeneously semi-melting said precursor by holding the same at a holding temperature $T_1°$ C. ($t_1+20 \leq T_1 \leq t_1+80$) for a prescribed time; and crystal-growing said precursor at a temperature not more than said melting point $t_1°$ C., wherein a holding temperature is selected in accordance with the following:

when said holding temperature $T_1(°$ C.) is equal to $t_1+20$, a holding time X (hour) satisfies $X>(d+2.3)/4$, when said holding temperature $T_1(°$ C.) is equal to $t_1+40$, a holding time X (hour) satisfies $X>(d-0.3)/6.8$ when said holding temperature $T_1(°$ C.) is equal to $t_1+60$, a holding time X (hour) satisfies $X>(d-0.5)/13.2$, and when said holding temperature $T_1(°$ C.) is equal to $t_1+80$, a holding time X (hour) satisfies $X>(d-2)/20$, assuming in each case that d represents the thickness of said precursor in said step of homogeneously semi-melting said precursor.

2. The method of preparing an oxide superconducting bulk body in accordance with claim 1, wherein said holding temperature $T_1(°$ C.) is equal to $t_1+20$, and a holding time X (hour) satisfies $X \geq (d+2.3)/4$ assuming that d represents the thickness of said precursor in said step of homogeneously semi-melting said precursor.

3. The method of preparing an oxide superconducting bulk body in accordance with claim 1, wherein said holding temperature $T_1(°$ C.) is equal to $t_1+40$, and a holding time X (hour) satisfies $X \geq (d-0.3)/6.8$ assuming that d represents the thickness of said precursor in said step of homogeneously semi-melting said precursor.

4. The method of preparing an oxide superconducting bulk body in accordance with claim 1, wherein said holding temperature $T_1(°$ C.) is equal to $t_1+60$, and a holding time X (hour) satisfies $X \geq (d-0.5)/13.2$ assuming that d represents the thickness of said precursor in said step of homogeneously semi-melting said precursor.

5. The method of preparing an oxide superconducting bulk body in accordance with claim 1, wherein said holding temperature $T_1(°$ C.) is equal to $t_1+80$, and a holding time X (hour) satisfies $X \geq (d-2)/20$ assuming that d represents the thickness of said precursor in said step of homogeneously semi-melting said precursor.

6. The method of preparing an oxide superconducting bulk body in accordance with claim 1, wherein said oxide superconducting bulk body is of an RE system (a single or mixed system of Nd, Sm, Eu, Gd, Dy, Y, Ho and/or Er).

7. The method of preparing an oxide superconducting bulk body in accordance with claim 1, wherein the precursor is a mixture of $REBa_2Cu_3O_{7-z}$ and $RE_4Ba_2Cu_2O_{10}$ powders and a platinum additive.

8. A method of preparing an oxide superconducting bulk body by melt growth through a seed crystal method, comprising steps of:

preparing a precursor by press-molding material powder obtained by mixing $REBa_2Cu_3O_{7-z}$ powder with $RE_2BaCuO_5$ or $RE_4Ba_2Cu_2O_{10}$ powder and a platinum additive;

homogeneously semi-melting said precursor by holding the same at a holding temperature $T_1°$ C. ($t_1+20 \leq T_1 \leq t_1+80$ assuming that the melting point of said oxide superconducting bulk body is $t_1°$ C.) for a prescribed time;

cooling said semi-melted precursor to a temperature $T_2°$ C. ($t_1 \leq T_2 \leq t_1+20$);

setting a seed crystal on said precursor cooled to said temperature $T_2°$ C.; and crystal-growing said precursor at a temperature not more than said melting point $t_1°$ C.

9. The method of preparing an oxide superconducting bulk body in accordance with claim 8, wherein said holding temperature $T_1(°$ C.) is equal to $t_1+20$, and a holding time X (hour) satisfies $X \geq (d+2.3)/4$ assuming that d represents the thickness of said precursor in said step of homogeneously semi-melting said precursor.

10. The method of preparing an oxide superconducting bulk body in accordance with claim 8, wherein said holding temperature $T_1(°$ C.) is equal to $t_1+40$, and a holding time X (hour) satisfies $X \geq (d-0.3)/6.8$ assuming that d represents the thickness of said precursor in said step of homogeneously semi-melting said precursor.

11. The method of preparing an oxide superconducting bulk body in accordance with claim 8, wherein said holding temperature $T_1(°$ C.) is equal to $t_1+60$, and a holding time X (hour) satisfies $X \geq (d-0.5)/13.2$ assuming that d represents the thickness of said precursor in said step of homogeneously semi-melting said precursor.

12. The method of preparing an oxide superconducting bulk body in accordance with claim 8, wherein said holding temperature $T_1(°$ C.) is equal to $t_1+80$, and a holding time X (hour) satisfies $X \geq (d-2)/20$ assuming that d represents the thickness of said precursor in said step of homogeneously semi-melting said precursor.

13. The method of preparing an oxide superconducting bulk body in accordance with claim 8, wherein said oxide superconducting bulk body is of an RE system (a single or mixed system of Nd, Sm, Eu, Gd, Dy, Y, Ho and/or Er).

14. A method of preparing an oxide superconducting bulk body by melt growth through a seed crystal method, comprising steps of:

preparing a precursor by press-molding material powder obtained by mixing $REBa_2Cu_3O_{7-z}$ powder with $RE_2BaCuO_5$ or $RE_4Ba_2Cu_2O_{10}$ powder and a platinum additive;

homogeneously semi-melting said precursor by holding the same at a holding temperature $T_1°$ C. ($t_1+20 \leq T_1 \leq t_1+80$ assuming that the melting point of said oxide superconducting bulk body is $t_1°$ C.) for a prescribed time;

cooling said semi-melted precursor to a temperature of not more than said melting temperature $t_1°$ C. and solidifying the same;

setting a seed crystal having a melting point $t_2°$ C. higher than said melting point $t_1°$ C. of said oxide superconducting bulk body on said solidified precursor;

melting said precursor at a temperature of at least $t_1°$ C. and not more than $t_2°$ C.; and crystal-growing said melted precursor at a temperature not more than said melting point $t_1°$ C.

15. The method of preparing an oxide superconducting bulk body in accordance with claim 14, wherein said holding temperature $T_1(°\ C.)$ is equal to $t_1+20$, and a holding time X (hour) satisfies $X \geq (d+2.3)/4$ assuming that d represents the thickness of said precursor in said step of homogeneously semi-melting said precursor.

16. The method of preparing an oxide superconducting bulk body in accordance with claim 14, wherein said holding temperature $T_1(°\ C.)$ is equal to $t_1+40$, and a holding time X (hour) satisfies $X \geq (d-0.3)/6.8$ assuming that d represents the thickness of said precursor in said step of homogeneously semi-melting said precursor.

17. The method of preparing an oxide superconducting bulk body in accordance with claim 14, wherein said holding temperature $T_1(°\ C.)$ is equal to $t_1+60$, and a holding time X (hour) satisfies $X \geq (d-0.5)/13.2$ assuming that d represents the thickness of said precursor in said step of homogeneously semi-melting said precursor.

18. The method of preparing an oxide superconducting bulk body in accordance with claim 14, wherein said holding temperature $T_1(°\ C.)$ is equal to $t_1+80$, and a holding time X (hour) satisfies $X \geq (d-2)/20$ assuming that d represents the thickness of said precursor in said step of homogeneously semi-melting said precursor.

19. The method of preparing an oxide superconducting bulk body in accordance with claim 14, wherein said oxide superconducting bulk body is of an RE system (a single or mixed system of Nd, Sm, Eu, Gd, Dy, Y, Ho and/or Er).

* * * * *